United States Patent

Berté et al.

[11] Patent Number: 4,517,485
[45] Date of Patent: May 14, 1985

[54] HIGH-FREQUENCY PIEZOELECTRIC RESONATOR WITH REINFORCED ELECTRODE CONNECTION

[75] Inventors: Marc Berté ; Louis Bidard; Serge Lechopier, all of Sartrouville, France

[73] Assignee: Compagnie d'Electronique et de Piezo-Electricite, Sartrouville, France

[21] Appl. No.: 498,513

[22] Filed: May 26, 1983

[30] Foreign Application Priority Data

Jun. 1, 1982 [FR] France .................. 82 09511

[51] Int. Cl.³ ............................. H01L 41/08
[52] U.S. Cl. .................. 310/320; 310/364; 310/369; 310/312
[58] Field of Search ........... 310/320, 367, 369, 364, 310/312

[56] References Cited

U.S. PATENT DOCUMENTS

| 2,095,376 | 10/1937 | Bechmann | 310/364 |
| 2,510,811 | 6/1950 | Gale | 310/364 X |
| 3,222,622 | 12/1965 | Curran et al. | 310/320 X |
| 3,396,287 | 8/1968 | Horton | 310/320 X |
| 3,694,677 | 9/1972 | Guttwein et al. | 310/369 |
| 3,721,841 | 3/1973 | Wilson | 310/364 |
| 3,940,638 | 2/1976 | Teryama | 310/364 X |
| 4,339,683 | 7/1982 | Scott et al. | 310/364 |

*Primary Examiner*—Mark O. Budd
*Attorney, Agent, or Firm*—Cushman, Darby & Cushman

[57] ABSTRACT

The high-frequency piezoelectric resonator comprises a quartz plate or disk having a region of reduced thickness which forms a diaphragm and is joined to the remainder of the plate or disk by means of a zone forming a step. A conductive electrode extends from the exterior of the disk or plate to the center of the thinned region and is provided with a conductive tongue constituted by a metallic film-layer of controlled thickness and disposed in the stepped zone. The method involves formation of the disk or plate by ion machining whereas the electrodes and the conductive tongue are formed by the sputtering technique.

2 Claims, 7 Drawing Figures

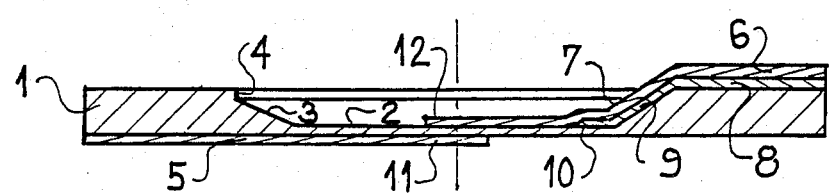
FIG_1
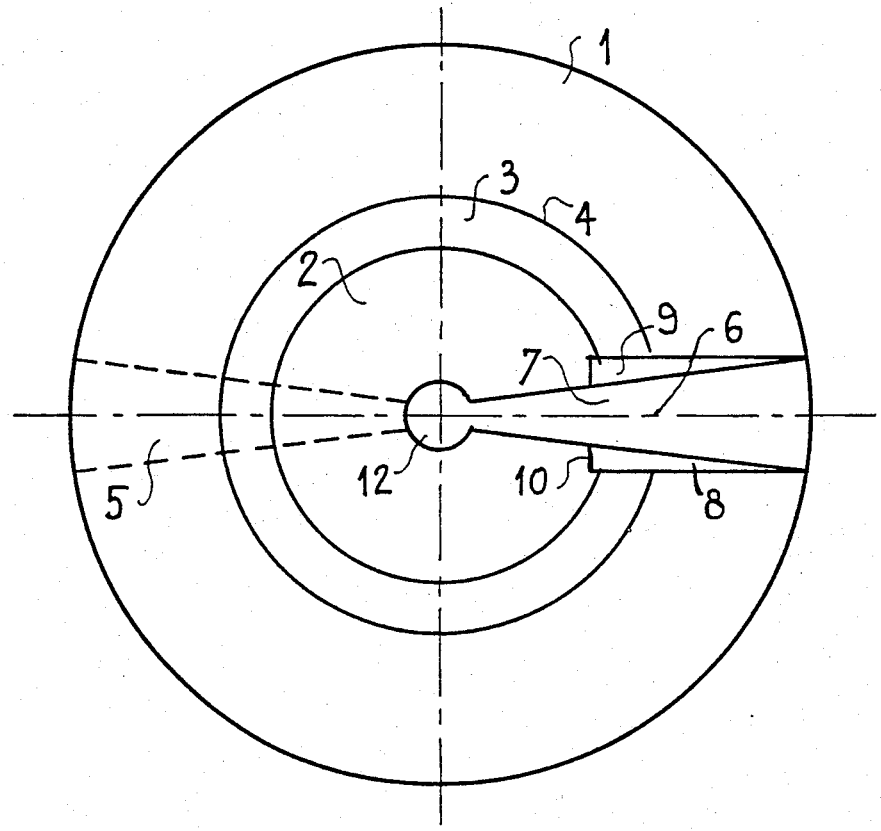
FIG_2

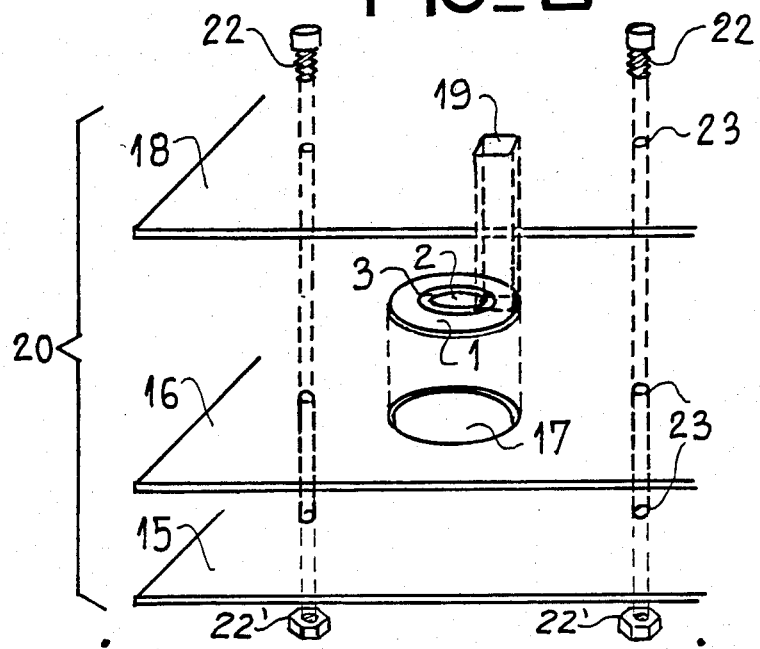
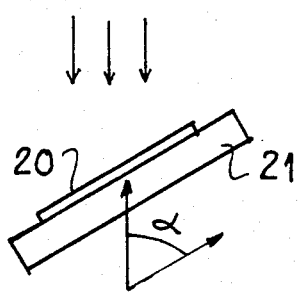
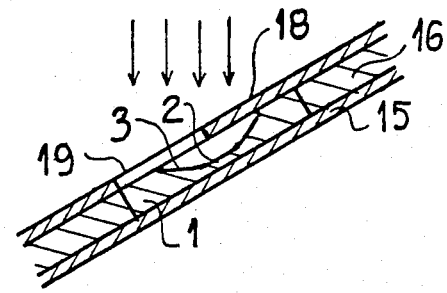
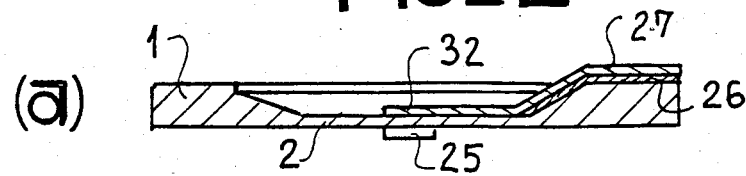
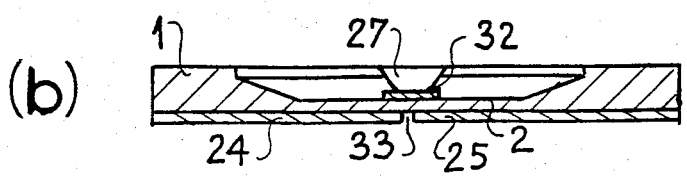

HIGH-FREQUENCY PIEZOELECTRIC RESONATOR WITH REINFORCED ELECTRODE CONNECTION

FIELD OF THE INVENTION

This invention relates to a high-frequency piezoelectric resonator and in particular a filter as well as to a method of fabrication of said resonator.

BACKGROUND OF THE INVENTION

U.S. Pat. No. 3,694,677 discloses a piezoelectric resonator in which a quartz disk is provided with a thinned central region forming a diaphragm, said thinned region being joined to the non-thinned region by a zone which forms a step. An electrode extends from the exterior of the disk across the stepped region to the center of the thinned region. There is placed on the other face of the disk another electrode which also extends from the periphery of the disk to the center of the thinned region. Said other face can be flat or else it can also have a stepped zone which must pass over the electrode.

It is found in practice that the fabrication of electrodes by sputtering or evaporation of a metal film-layer does not prove satisfactory. The fabrication of these electrodes must in fact meet a number of essential requirements. In the first place, the electrodes must have an electrical resistance which is as low as possible and must also be capable of withstanding the vibrations to which the crystal is subjected. In the second place, the electrodes must not have an excessive mass in order to avoid any risk of producing considerable changes in the frequency of the crystal.

In practice, the electrodes employed are of silver or preferably of aluminum since this is a relatively light-weight material having good electrical conductivity. The thickness of the electrodes is of the order of approximately 1000 Angstroms, thus making it possible to obtain a resonator having a high Q factor or loaded quality factor.

If the electrodes are fabricated in accordance with the method taught by U.S. Pat. No. 3,694,677, it is found that they have a brittle point at the level of the step. This means that, after a certain period of use and sometimes even immediately after the aging treatment usually performed in order to stabilize the resonator, this latter becomes unserviceable as a result of interruption of electrical continuity.

The production of a reliable piezoelectric resonator therefore makes it necessary to modify the fabrication of the electrodes in order to ensure satisfactory service life of said electrodes.

Furthermore, the present Applicant has found that any accumulation of material at the level of the stepped zone induces stresses in the thinned region of the crystal. These stresses impair the thermal drift of the crystal.

SUMMARY OF THE INVENTION

Accordingly, it is an object of the present invention to provide a high-frequency resonator having electrodes which are reliable over a long period of time without thereby affecting the properties of the resonator.

The invention also relates to a high-frequency piezoelectric resonator of the type comprising a plate or disk of quartz (or like piezoelectric material) in which a non-thinned region surrounds a thinned region forming a diaphragm. The thinned region is joined to the non-thinned region by means of at least one zone forming a step and provision is made for at least one electrode which extends across the step from the non-thinned region to the thinned region. The resonator is distinguished by the fact that said electrode is associated with a conductive tongue formed by a metallic film-layer deposited in the stepped zone.

Said metallic film-layer is preferably deposited by sputtering or vacuum evaporation.

The conductive tongue aforesaid can be placed beneath the electrode and can be of gold.

The tongue can have a mean thickness of the order of 1000 Angströms.

One electrode can be of silver.

One electrode can have a thickness within the range of 500 to 1000 Angströms.

The conductive tongue can be of greater width.

Said conductive tongue can extend from the non-thinned region to that portion of the thinned region which is adjacent to the stepped zone.

The invention further relates to a resonator made up of two elementary resonators coupled together in such a manner as to form a filter.

Finally, the invention is concerned with a method of fabrication of a resonator of the aforementioned type comprising a preliminary step of formation by ion machining of a region of reduced thickness in the central portion of a quartz plate or quartz disk, the thinned region being separated from the non-thinned region by a zone which forms a step. The invention essentially comprises the following process steps:

(a) a step involving deposition of a conductive tongue which extends across the stepped zone;

(b) a step which involves mounting of the plate or disk on at least two conductive masts by means of a conductive cement; and (c) a step involving deposition of the electrodes, one electrode being so arranged as to cover the conductive tongue at least to a partial extent, deposition by the sputtering technique being performed in such a manner as to ensure that each conductive mast aforesaid is in contact with one electrode.

In a preferred embodiment, the method comprises an operation involving measurement of the resonator frequency during deposition of the electrodes in such a manner as to stop the deposition process as soon as the desired value of frequency has been attained.

BRIEF DESCRIPTION OF THE DRAWINGS

Other features of the invention will be more apparent upon consideration of the following description and accompanying drawings, wherein:

FIGS. 1 and 2 are respectively a vertical sectional view and a top view illustrating a resonator in accordance with the invention;

FIG. 3 illustrates a masking device for the formation of the conductive tongues in accordance with the invention;

FIGS. 4 and 5 illustrate the deposition operations involved in the formation of the conductive tongues in accordance with the invention; and FIGS. 6a and 6b are two vertical sectional views at right angles to each other and showing a resonator in accordance with the invention and in which the electrodes are so arranged as to form a filter.

DETAILED DESCRIPTION OF THE PREFERRED EMBODIMENT

In FIGS. 1 and 2, a piezoelectric disk comprises a non-thinned peripheral region 1 surrounding a thinned region 2, the junction between these two regions being constituted by a zone forming a step as a result of an ion machining process. Starting from the surface, the step is constituted by a cylindrical region 4 followed by a conical region 3. For example in the case of a disk having a thickness of 50 microns and a thickness of the diaphragm 2 of the order of 5 to 10 microns, the cylindrical region 4 has a depth of approximately 10 microns. One of the electrodes 5 is placed on the flat underface of the disk and extends from the periphery of this latter to the center of the diaphragm 2 and terminates in a circular central region 11. The electrode 5 has the general shape of a triangle having two sides of substantial equal length and a base of a length substantially less than the length of either of the two sides, the base of which is located at the periphery of the disk and the vertex (at which the two sides intersect) of which is located at the center of the diaphragm 2. This shape facilitates the electrical connection of the electrodes at their periphery while adding the smallest possible quantity of material at the level of the diaphragm 2.

The other electrode 6 also extends from the periphery of the disk to the center of the diaphragm 2 and terminates in a circular central region 12 located opposite to the circular region 11. Likewise said electrode has the general shape of a triangle, the base of which is located at the periphery of the disk. A conductive tongue 8 is preferably placed beneath the electrode 6 and extends from the periphery of the disk to the external portion of the diaphragm 2 which is adjacent to the stepped zone 3. Said conductive tongue 8 is a metallic layer which is deposited on the disk and has a rectangular shape when looking from above. The rectangle so defined has a side disposed at the periphery of the disk of a length substantially equal to the length of the base of the triangle in which the electrode is shaped. The width of the portion of the rectangle near the periphery of the disk is substantially equal to the width of the portion of the rectangle disposed on diaphragm 2. In this embodiment, the tongue 8 is therefore of greater width than the electrode, thus increasing the area on which an electrical contact is established at the level of the stepped zone. (The surface area of the portion of conductive tongue 8 which contacts stepped zone 3 is greater than the surface area of the portion of electrode 6 disposed on the portion of the conductive tongue which contacts the stepped zone. Furthermore, the conductive tongue 8 extends at the level of the diaphragm over a distance which is just sufficient to facilitate electrical connection at the level of the step. The area of the portion of the surface area of diaphragm 2 upon which conductive tongue 8 is disposed is smaller than the area of the diaphragm upon which electrode 6 is disposed. It will be noted that the active zone of the conductive tongue is constituted by the portion located at the level of the step or in other words the zone shown at 9, by the portion 10 which extends over a minimum distance on the diaphragm 2, and by the portion which is joined to the flat portion of the electrode 6.

In FIG. 3, a masking device 20 for the formation of the conductive tongues comprises a base plate 15, an intermediate plate 16 provided with a plurality of holes 17 (only one of which is illustrated), and a top plate 18 provided with openings 19 (only one of which is illustrated) corresponding to the shape of the conductive tongues to be formed on a piezoelectric disk provided with a diaphragm 2. The holes 17 have an external diameter corresponding to the diameter of the piezoelectric disks. The thickness of the intermediate plate 16 is substantially greater than that of the piezoelectric disks, with the result that the disks are maintained in position by clamping between the plates 15 and 18. The plates 15, 16 and 18 are held together by means of clamping screws 22 which are engaged within holes 23 and cooperate with nuts 22'.

As shown in FIG. 4, the support 20 fitted with the piezoelectric disks is mounted on a plate 21 which is inclined at an angle $\alpha$ with respect to the direction of sputtering or evaporation.

As shown in detail in FIG. 5, the portion of region 3 on which the conductive tongue is formed can be placed substantially at right angles to the direction of sputtering as a result of the angle of inclination aforesaid. Maximum thickness in the active zone of the conductive tongue can thus be obtained by evaporation. The conductive tongue 8 can be of any metal which permits deposition either by sputtering or evaporation, gold being particularly suitable for this purpose. Its thickness (for example of the order of 1000 Ångströms) is such as to permit reinforcement of the electrode 6 without adding an excessive quantity of material at the level of the stepped portion.

Each piezoelectric disk fitted with its conductive tongue is bonded to two conductive masts by means of a conductive cement. The electrodes 5, 6 are then deposited, each of the electrodes being in contact with one of the masts. The electrode which extends across the stepped portion covers the conductive tongue at least partially.

During deposition of the electrodes, the frequency of the resonator is measured as soon as this is permitted by the thickness of the electrodes. The addition of material at the level of the diaphragm as a result of deposition of the electrodes has the effect of reducing the frequency of the quartz. The deposition operation is interrupted when the desired frequency of the quartz is precisely attained.

In a subsequent process step, the quartz is placed within a vacuum-tight enclosure and subjected to an aging treatment (residence time of a few hours at a temperature of the order of 95° C.).

As shown in FIGS. 6a and 6b, a piezoelectric filter is obtained at the level of a diaphragm 2 as a result of coupling between two individual resonators. To this end, two electrodes are placed close together on one of the faces of the diaphragm, and a grounded electrode is disposed on the opposite face, thereby ensuring that its extremity is located opposite to the gap between the two electrodes of the other face. Thus one electrode 27 is disposed on the top face of a quartz disk, extends from the periphery of said disk to the center of the diaphragm 2, and has a circular termination 32 at the center. Two electrodes 24 and 25 disposed in a general direction at right angles to the electrode 27 extend from the periphery of the underface of the piezoelectric disk to the center of the diaphragm 2. At the center, a gap 33 is left between said electrodes 24 and 25 and the width of said gap determines the coupling between the two resonators.

What is claimed is:

1. A high frequency piezoelectric resonator comprising:
   a disk comprising a predetermined thickness of piezoelectric material, said disk defining, in said piezoelectric material, a first surface, said disk including:
   means for defining a cavity in the first surface of said disk, said first surface surrounding said cavity, said cavity-defining means including:
   means for defining a second surface, said second surface defined in said piezoelectric material lying within said cavity, and
   means for defining, in said piezoelectric material, at least one stepped zone disposed between said first surface and said second surface and connecting said first surface with said second surface; and
   electrode means, disposed on said first surface, extending across said stepped zone, and disposed on said second surface, for establishing electrical contact with said second surface, said electrode means including:
   an electrode member, and
   conductive tongue means, extending across said stepped zone onto a portion of said second surface adjacent to said stepped zone, said conductive tongue means superimposed with said electrode member, said conductive tongue means comprising a layer of metallic film, said conductive tongue means for increasing the reliability of the electrical contact provided across said stepped zone by said electrode means, wherein:
   at least part of said conductive tongue means is disposed on said stepped zone,
   at least a part of said electrode member is disposed on the part of said conductive tongue means disposed on said stepped zone, the surface area of the part of said conductive tongue means disposed on said stepped zone being greater than the surface area of the part of said electrode member disposed on the part of said conductive tongue means which is disposed on said stepped zone, and
   said electrode member comprises a first portion shaped as a triangle having first and second sides of substantially equal length and a base of a length substantially different from the length of either of said first and second sides, said base being disposed on said first surface at the periphery of said disk, the vertex of said triangle connecting said first and second sides being disposed on said second surface at the center of said cavity.

2. A resonator as in claim 1 wherein said conductive tongue means comprises a layer of metal shaped as a rectangle having a first side of a length substantially equal to the length of said base of said triangle, said first side disposed on said first surface at the periphery of said disk.

* * * * *